United States Patent [19]
Seabaugh

[11] Patent Number: 5,796,119
[45] Date of Patent: Aug. 18, 1998

[54] SILICON RESONANT TUNNELING

[75] Inventor: Alan C. Seabaugh, Richardson, Tex.

[73] Assignee: Texas Instruments Incorporated, Dallas, Tex.

[21] Appl. No.: 145,267

[22] Filed: Oct. 29, 1993

[51] Int. Cl.⁶ .............. H01L 29/04; H01L 29/88
[52] U.S. Cl. .............. 257/25; 257/17; 257/22; 257/28; 257/30
[58] Field of Search .............. 257/17, 22, 25, 257/28, 30

[56] References Cited

U.S. PATENT DOCUMENTS

| | | | |
|---|---|---|---|
| 5,216,262 | 6/1993 | Tsu | 257/25 |
| 5,229,623 | 7/1993 | Tanoue | 257/25 |
| 5,234,848 | 8/1993 | Seabough | 257/25 |
| 5,336,904 | 8/1994 | Kusunoki | 257/25 |

FOREIGN PATENT DOCUMENTS

| | | | |
|---|---|---|---|
| 0194061 | 9/1986 | European Pat. Off. | 257/28 |
| 63-124462 | 5/1988 | Japan | 257/28 |
| 3262161 | 11/1991 | Japan | 257/25 |

OTHER PUBLICATIONS

Canham, *Appl. Phys. Lett.* (10), 3 Sep. 1990 pp. 1046–1048 "Silicon Quantum Voice . . . Wafers".

*Primary Examiner*—Jerome Jackson
*Attorney, Agent, or Firm*—Carlton H. Hoel; W. James Brady; Richard L. Donaldson

[57] ABSTRACT

A resonant tunneling diode (400) made of a silicon quantum well (406) with silicon oxide tunneling barriers (404, 408). The tunneling barriers have openings (430) of size smaller than the electron wave packet spread to insure crystal alignment through the diode without affecting the tunneling barrier height.

9 Claims, 7 Drawing Sheets

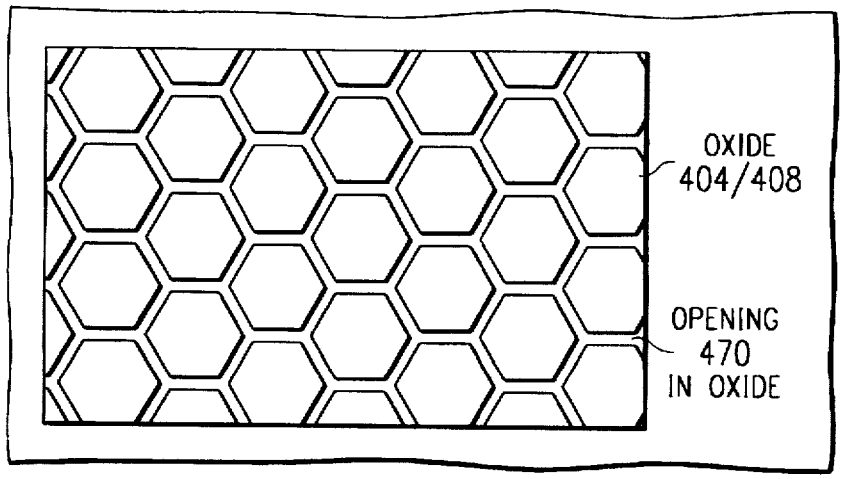
FIG. 4d
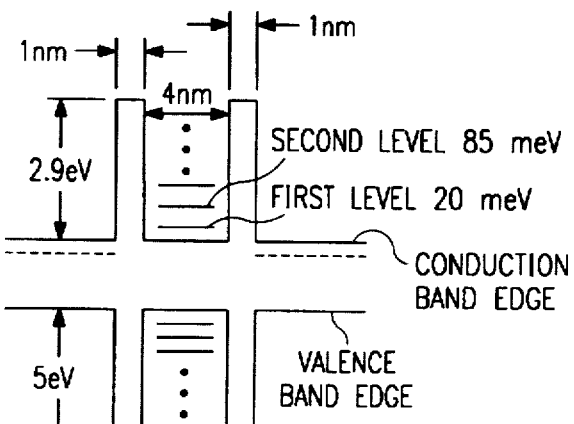
FIG. 5a
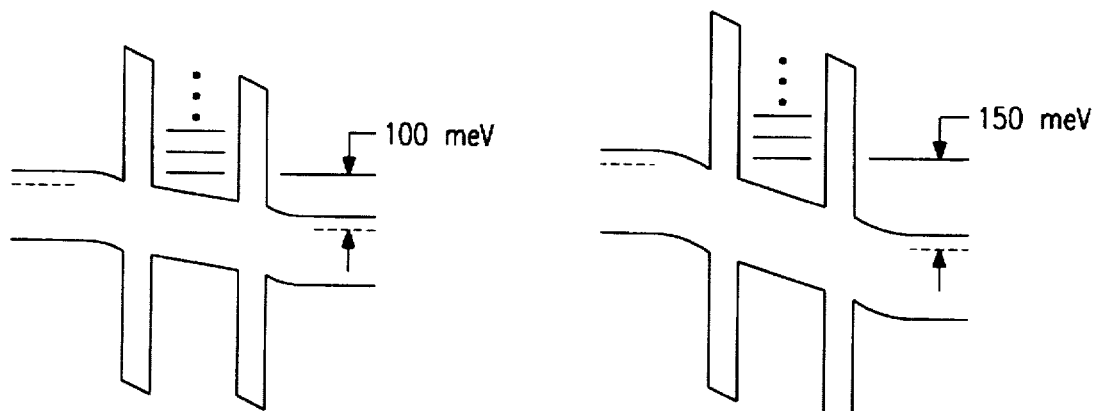
FIG. 5b
FIG. 5c

SILICON RESONANT TUNNELING

BACKGROUND OF THE INVENTION

The invention relates to electronic devices, and, more particularly, to resonant tunneling devices and systems.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1 which illustrates a AlGaAs/GaAs quantum well. Further, Mars et al., Reproducible Growth and Application of AlAs/GaAs Double Barrier Resonant Tunneling Diodes, 11 J.Vac.Sci.Tech.B 965 (1993), and Özbay et al, 110-GHz Monolithic Resonant-Tunneling-Diode Trigger Circuit, 12 IEEE Elec.Dev.Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

Attempts to fabricate quantum wells in silicon-based semiconductors, rather than the III–V semiconductors such as AlGaAs and GaAs, have focussed primarily on silicon-germanium alloys. For example, the Topical Conference on Silicon-Based Heterostructures II (Chicago 1992) included papers such as Grützmacher et al., Very Narrow SiGe/Si Quantum Wells Deposited by Low-Temperature Atmospheric Pressure Chemical Vapor Deposition, 11 J.Vac.Sci.Tech.B 1083 (1993)(1 nm wide wells of $Si_{0.75}Ge_{0.25}$ with 10 nm wide Si tunneling barriers) and Sedgwick et al., Selective SiGe and Heavily As Doped Si Deposited at Low Temperature by Atmospheric Pressure Chemical Vapor Deposition, 11 J.Vac.Sci.Tech.B 1124 (1993)(Si/SiGe resonant tunneling diode selectively grown in an oxide window with silicon tunneling barriers each 5 nm wide and a 6 nm wide quantum well of $Si_{0.75}Ge_{0.25}$. Because the valence band offset greatly exceeds the conduction band offset at SiGe/Si interfaces, most investigators consider hole tunneling rather than electron tunneling using strained layer SiGe.

However, SiGe strained layers possess a serious intrinsic impediment in that the band discontinuities are small (less than 500 meV). This precludes room temperature operation with large peak-to-valley current differences (greater than approximately 5). Further, the addition of a strained heterojunction and new material, germanium, necessitates the undesirable development and implementation of new low temperature fabrication methods to allow production.

Tsu, U.S. Pat. No. 5,216,262, describes a silicon-based quantum well structure with tunneling barriers made of short period silicon/silicon dioxide superlattices of epitaxial silicon dioxide two monolayers thick.

Numerous investigators have studied the silicon/silicon oxide interface because it underlies performance of the currently prevalent CMOS transistor structure of silicon integrated circuits. The growth and analysis of single molecular layers of oxide have become commonplace. For example, Ohmi et al., Very Thin Oxide Film on a Silicon Surface by Ultraclean Oxidation, 60 Appl.Phys.Lett. 2126 (1992); Hattori, High Resolution X-ray Photoemission Spectroscopy Studies of Thin $SiO_2$ and $Si/SiO_2$ Interfaces, 11 J.Vac.Sci.Tech.B 1528 (1993); and Seiple et al., Elevated Temperature Oxidation and Etching of the Si(111) 7×7 Surface Observed with Scanning Tunneling Microscopy, 11 J.Vac.Sci.Tech.A 1649 (1993). The Ohmi et al. article observes that an oxide monolayer formed on a silicon wafer at 300° C. provides the foundation for oxide films superior to standard thermal oxide with respect to Frenkel-Poole emission for thin oxide films.

SUMMARY OF THE INVENTION

The present invention provides silicon-based resonant tunneling diodes and transistors by use of perforated silicon dioxide tunneling barriers for epitaxial alignment of anode, cathode, and quantum well silicon layers.

BRIEF DESCRIPTION OF THE DRAWINGS

The drawings are schematic for clarity.

FIGS. 4a–d illustrate a first embodiment diode in cross sectional elevation and alternative plan views.

FIGS. 5a–c are band diagrams for the first preferred embodiment diode with various biases.

DESCRIPTION OF THE PREFERRED EMBODIMENTS

Figure 4A:
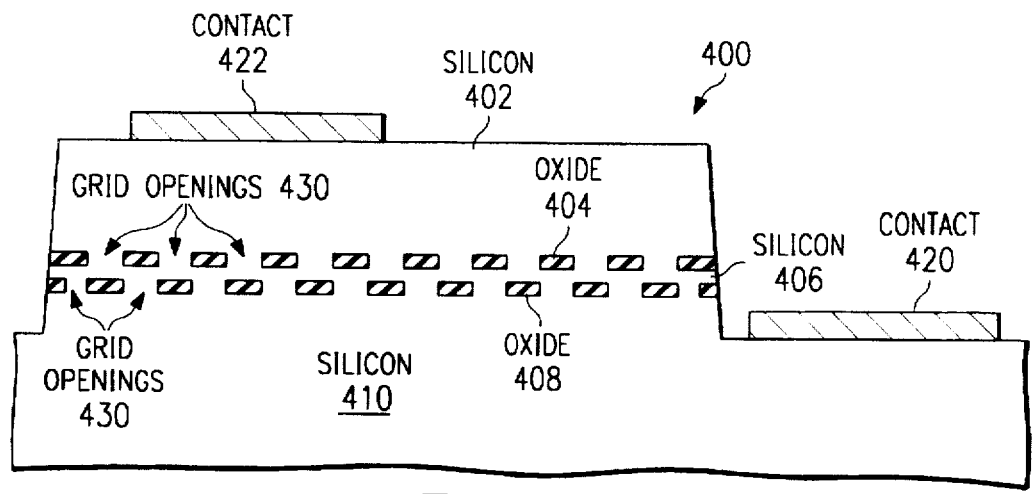
Figure 4B:
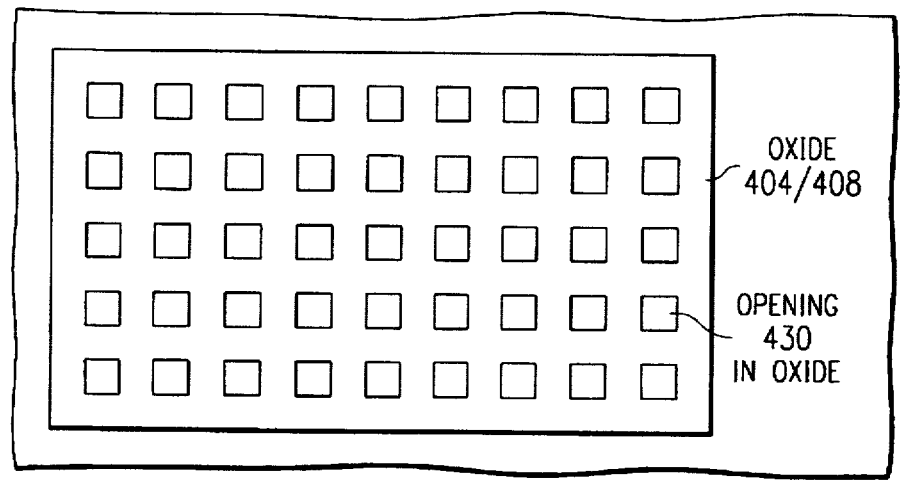

First preferred embodiment resonant tunneling diode FIGS. 4a–b heuristically show first preferred embodiment resonant tunneling diode, generally denoted by reference numeral 400, in cross sectional elevation and plan views as including silicon anode 402, silicon dioxide ("oxide") tunneling barrier 404, silicon quantum well 406, oxide tunneling barrier 408, silicon cathode 410, anode metal contact 422, and cathode metal contact 420. Tunneling barriers 404 and 408 each has the structure of a grid with a period of about 20 nm and a separation less than approximately 4 nm in grid openings 430. The plan view in FIG. 4b illustrates the grid structure of each of the tunneling barriers 404/408. Tunneling barriers 404/408 are each about 1 nm thick (roughly 4 molecular layers and amorphous) with transition layers and about 1 μm by 2 μm (thus FIGS. 4a–b are not to scale in that there should be roughly 50 rows of 100 openings 430 in each tunneling barrier, and not the 5 rows of 9 openings illustrated in FIG. 4b). Quantum well 406 is about 4 nm thick. Note that the thickness of barriers 404/408 primarily impacts the tunneling current magnitude and not the resonance levels which derives from the quantum well width and the barrier heights. Also, the exact electronic and chemical nature of the tunneling barriers varies through the barrier.

The spread of a wave packet describing an electron in a periodic potential (i.e., an electron in the single crystal silicon of anode 402, quantum well 406, or cathode 410) is roughly the reciprocal of the spread of wave vectors making up the wave packet. Thus with a spread of wave vectors small compared to dimensions of the Brillouin zone (which would be required for any resonance with respect to wave vector), the wave packet spread is over many crystal primitive cells. The wave packet spread in silicon is at least roughly 4 nm or more than 7 primitive cells. Each of openings 430 in the tunneling barrier oxides has a diameter of at most 4 nm and may be smaller. Hence, tunneling barriers 404/408 will appear to electrons (wave packets) as continuous and without penetrable openings.

The width of quantum well 406 as 4 nm implies the edges of the lowest conduction subbands should lie at about 20 meV, 85 meV, 200 meV, and 350 meV above the conduction band edge due to the quantized component of crystal momentum in the quantum well. The conduction band offset at the silicon/oxide interface for very thin oxide is about 2.9 eV (compared with 3.2 eV for thick oxide), so FIG. 5a–c represents the band diagram for electron conduction through diode 400. In FIG. 5a a zero bias produces no current; in FIG. 5b a bias of approximately 100 mV across diode 400 yields the first resonant peak current; and in FIG. 5c a bias of approximately 150 mV across diode 400 leads to the first valley current. Note that anode 402 may be doped n+ except for a few nm abutting barrier 404, and cathode 410 may be also be doped n+ except for a few nm abutting barrier 408. Spacing the doping from the tunneling barriers avoids incorporating dopant atoms into the tunneling barrier and grid spacing regions where impurity-assisted tunneling can result. With a doped anode and cathode, the majority of the applied bias between anode and cathode appears across the barriers and quantum well. The dielectric constant of silicon is about three times that of oxide, so the applied voltage drop roughly splits into one third across the oxide barriers, one third across the quantum well, and one third across the undoped anode and cathode abutting the oxide barriers. The breakdown voltage for oxide is on the order of 10 MV/cm, so to avoid breakdown currents which may destroy the oxide barriers, voltage drops must be less than about 3 volts across the entire double barrier neglecting depletion on the cathode side of the tunneling barriers.

Figure 4C:
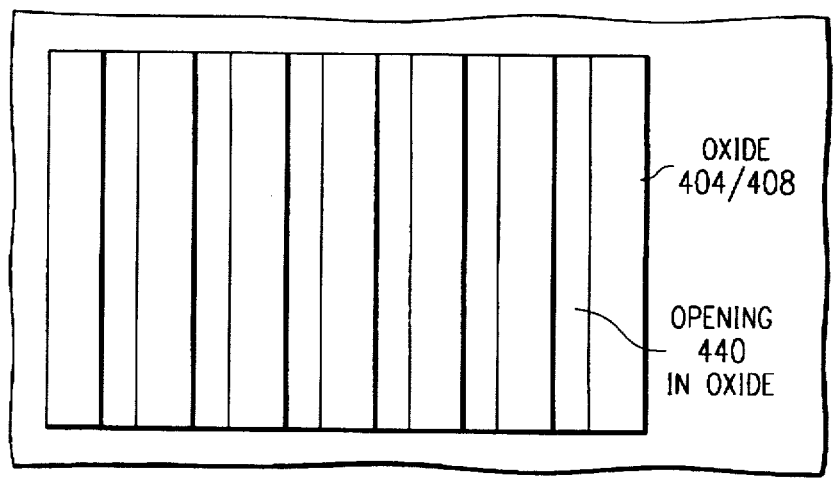
Figure 6A:
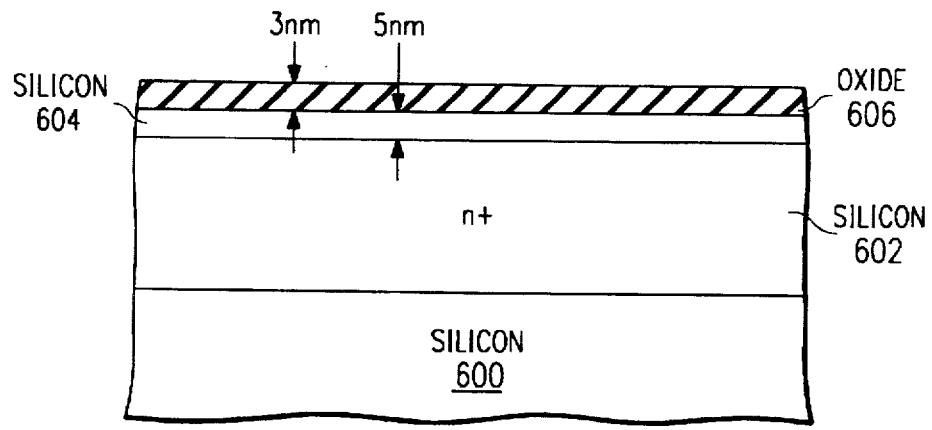
FIGS. 6a–e show fabrication steps of the first preferred embodiment diode.
Figure 6B:
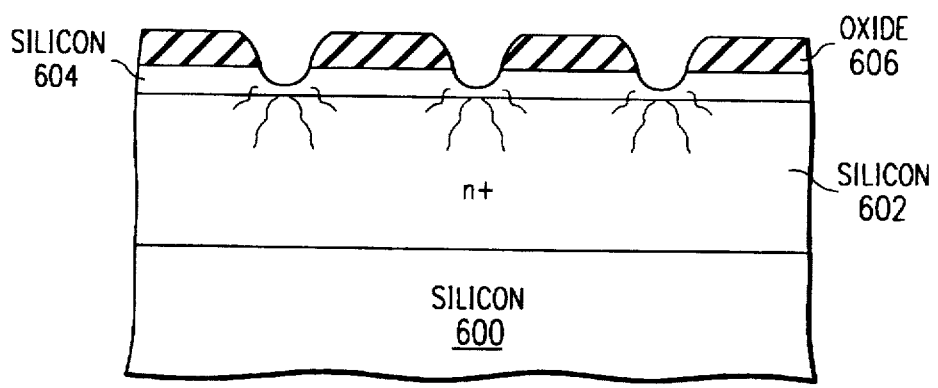
Figure 6C:
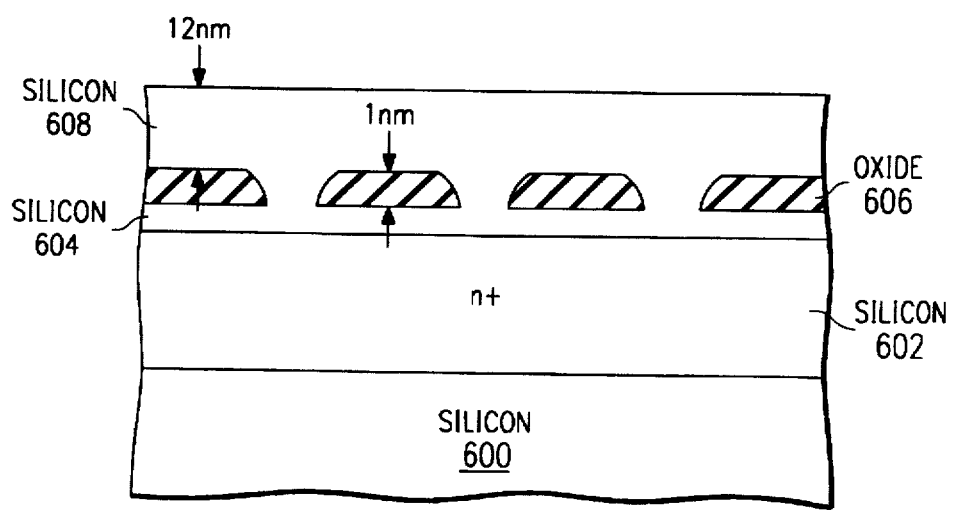
Figure 6D:
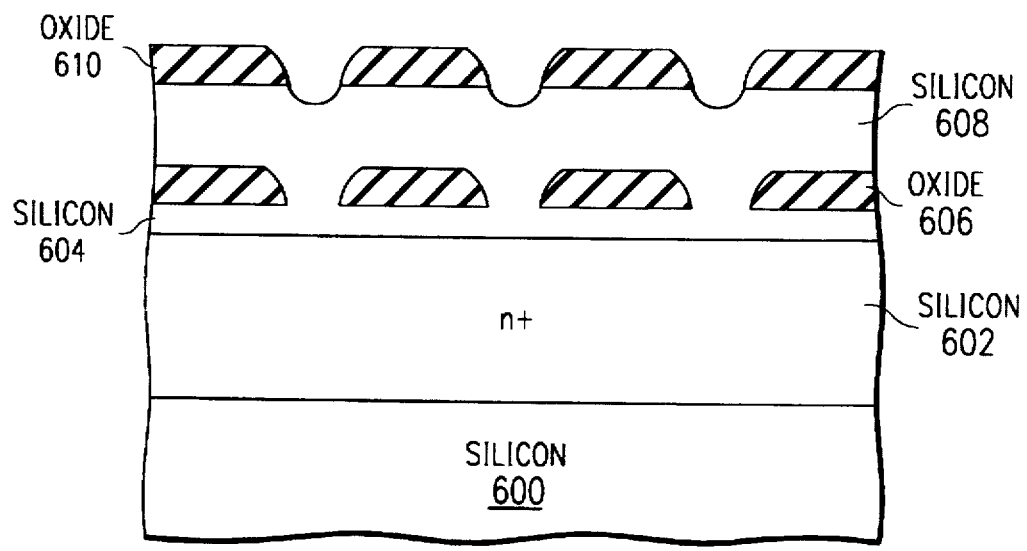
Figure 6E:
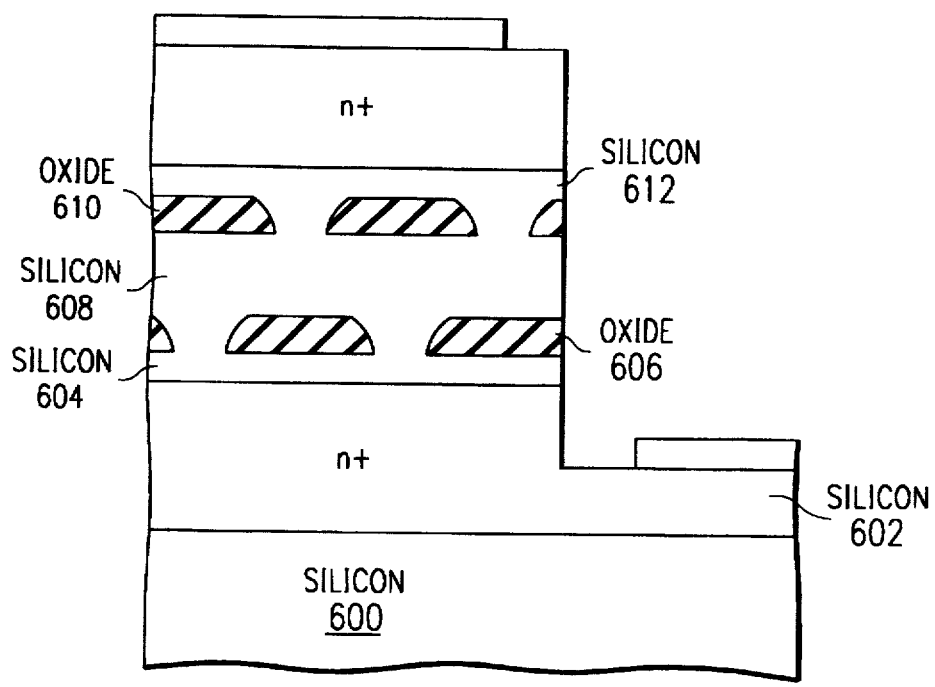

FIG. 4c shows in plan view an alternative set of openings 440 in tunneling barrier oxides 404 and 408. The alternative openings 440 are parallel 4 nm wide slots which separate regions of tunneling barrier oxide. The orientation of openings may be arbitrary. As long as at least one dimension of the openings is less than about 4 nm, the tunneling barrier will be a barrier.

Similarly, FIG. 4d shows in plan view a further alternative openings 470 in tunneling barrier oxides 404 and 408. The alternative opening 470 is a 4 nm wide net which separates the tunneling barrier oxide into an array of hexagons. The orientation of openings may be arbitrary. As long as at least one dimension of the openings is less than about 4 nm, the tunneling barrier will be a barrier. Also, the extensive area for the silicon epitaxial growth may simplify the epitaxy.

Diode 400 thus provides resonant tunneling in a system using only standard integrated circuit materials: silicon and oxide; and may operate at room temperature.

Fabrication

FIGS. 6a–e illustrate in cross sectional elevation views a first preferred embodiment method of fabrication of diode 400 which includes the following steps:

(a) Begin with 25-mil thick, four-inch diameter, (100)-oriented silicon wafer 600. Epitaxially grow 1 µm thick n+ layer of silicon 602 on wafer 600 in an LPCVD (low pressure chemical vapor deposition) reactor by decomposition of dichlorosilane with stibine ($SbH_3$) for in situ antimony doping. Next, clean wafer 600 by first rinsing in an HF/$NH_4F$ solution to remove the roughly 1.4 nm of native oxide which grows when wafer 600 contacts air and then rinsing with deionized water. The HF/$NH_4F$ rinse stabilizes the oxide-free silicon surface by forming a monohydride surface layer. Next, insert wafer 600 into a molecular beam epitaxy (MBE) growth chamber and desorb the hydrogen, and then grow 7 nm of undoped epitaxial silicon 604 at about 500° C. Remove wafer 600 from the MBE growth chamber and again perform the HF/$NH_4F$ plus water cleaning which will leave about 6 nm of undoped hydride stabilized silicon 604. Next, insert wafer 600 into a furnace and heat it to 300° C. in an oxygen free argon atmosphere, and then oxidize wafer 600 at 300° C. in a moisture free oxygen atmosphere. This desorbs the hydrogen and grows a monolayer of oxide. A greater thickness of oxide is desired, so after the oxide monolayer growth, heat the wafer to a growth temperature of 900° C. in oxygen free argon, and then inject sufficient oxygen to grow about 3 nm of oxide 606. See FIG. 6a.

(b) Insert wafer 600 into an ion beam lithography machine, and use a beam of protons (hydrogen ions) at 20 KeV to remove oxide in 4 nm diameter openings from oxide 606 in a grid pattern. Focus the ion beam to a spot size of less than 4 nm, and raster scan the ion beam across wafer 600. Note that the beam need not be aligned to anything and just a pattern of about 4 nm diameter openings need be produced. The low pressure within an ion beam machine will desorb roughly one monolayer of oxide 606 in the form of SiO from areas not sputtered away. In effect, about a monolayer of SiO may be lost due to evaporation in the low pressure; the oxide openings will form by oxygen and silicon atoms being sputtered away; and some silicon beneath the sputtered oxide will also be sputtered away or removed by formation of water vapor. The crystal damage will not be severe due to the low beam energy, and a later temperature cycle will anneal out the damage. See FIG. 6b which indicates crystal damage with wavy lines.

(c) Remove wafer 600 from the ion beam machine and again clean with the HF/$NH_4F$ plus water rinses to remove native oxide which grows on the silicon exposed by the openings in oxide 606. This also removes about 2 nm of oxide 606, leaving just a little more than the desired less than 1 nm thick tunneling barrier. Again, the HF/$NH_4F$ rinse stabilizes the oxide-free silicon surface exposed by the openings in oxide 606 through formation of a hydride monolayer. Then insert wafer 600 into a molecular beam epitaxy (MBE) growth chamber and desorb the hydrogen and anneal the ion beam crystal damage with a short temperature cycle up to 800° C. and then grow undoped epitaxial silicon 608 at 500° C. The short high temperature cycle anneals out the residual crystal damage without significantly evaporating oxide; the usual MBE native oxide desorption employs 1000°–1250° C. The epitaxial growth begins on the exposed silicon in the oxide openings and eventually spreads laterally across oxide 606. Continue growth until silicon 608 is 6 nm thick on oxide 606. Remove wafer 600 from the MBE growth chamber and again apply the HF/NH$_4$F plus water rinse cleanup to remove the native oxide and yield a stabilized oxide-free hydrided silicon surface. See FIG. 6c.

(d) Again insert wafer 600 into a furnace and heat it to 300° C. in an oxygen free argon atmosphere, and then oxidize wafer 600 at 300° C. in a moisture free oxygen atmosphere to grow a monolayer of oxide. After the oxide monolayer growth, heat the wafer to a growth temperature of 900° C. in oxygen free argon, and then inject sufficient oxygen to grow about 3 nm of oxide 610. Then repeat step (b) to form a grid of 4 nm diameter openings in oxide 610 by ion beam sputtering. This grid need not be aligned to the grid from step (b) and may in fact have a different period. See FIG. 6d.

(e) Lastly, repeat step (c) but grow only 6 nm of silicon 612 on oxide 610. Then by LPCVD epitaxially grow 200 mm of in situ doped silicon by decomposition of dichlorosilance plus stibine. Then photolithographically pattern and mesa etch with a fluorine based etch plus deposit anode and cathode contact metal to complete the diode; see FIG. 6e.

Note that the ion beam lithography could be incorporated into the MBE machine and thereby avoid some of the wafer transfer operations. In such a case, the ion beam could be used for silicon surface cleaning. Further, oxide growth could be performed within the MBE machine by using beams of both silicon and oxygen as suggested in the Tsu patent cited in the background, although the lattice matched oxide of Tsu is not required in the preferred embodiments.

Second preferred embodiment

Figure 7:
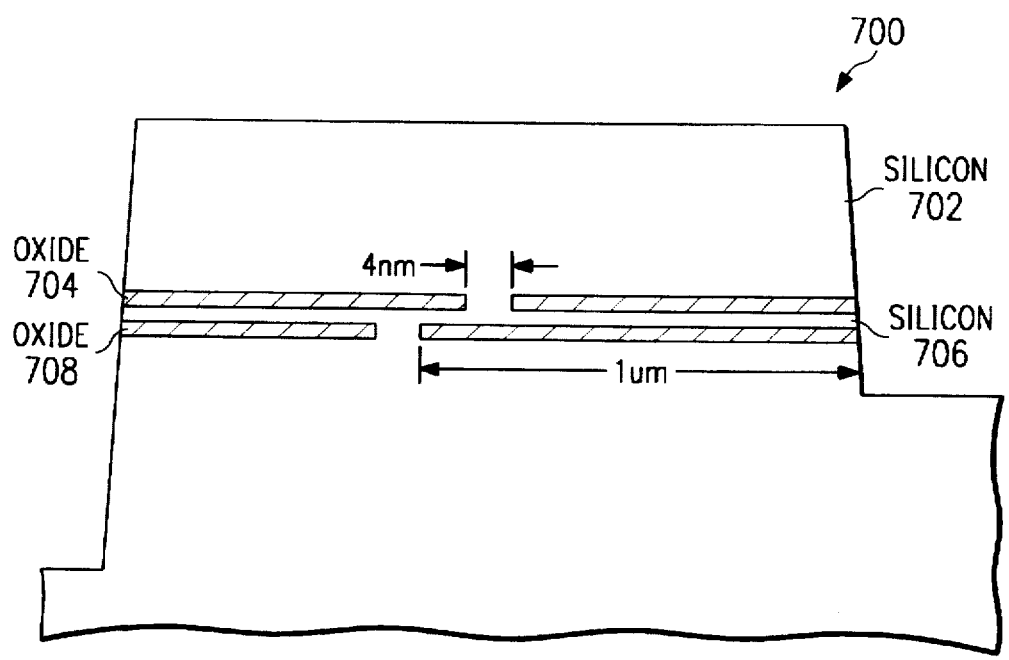
FIGS. 7–8 illustrate other preferred embodiment diodes.

FIG. 7 heuristically illustrates in cross sectional elevation view second preferred embodiment silicon/oxide resonant tunneling diode 700 which differs from diode 400 by having the 4 nm diameter openings 730 in oxide tunneling barriers 704 and 708 spaced about 1 µm apart rather than the 16 nm apart of diode 400. Again the openings in the oxide tunneling barriers are small enough to prevent electrons from passing through but still provide a crystal alignment mechanism for insuring epitaxial growth of quantum well 706 and anode 702. The fabrication of diode 700 follows that of diode 400; however, the epitaxial silicon growth may require a higher growth temperature (e.g., 800° C.) or rapid thermal annealing (xenon flash lamps) or both to insure the single crystal character of the silicon epilayers. Indeed, if the spacing between openings exceeds the diameter of the diode, then the mesa etch can eliminate the openings and provide uninterrupted oxide tunneling barriers. In this case the oxide openings need not be of diameter less than 10 nm and could in fact be a wide ring encircling the eventual tunneling barrier. The ease of lateral recrystallization of the roughly 6 nm thick quantum well silicon layer will determine the diode diameter. Of course, thicker silicon could be grown and etched back in various ways, such as by cycles of native oxide growth and removal.

Third preferred embodiment

Figure 8:
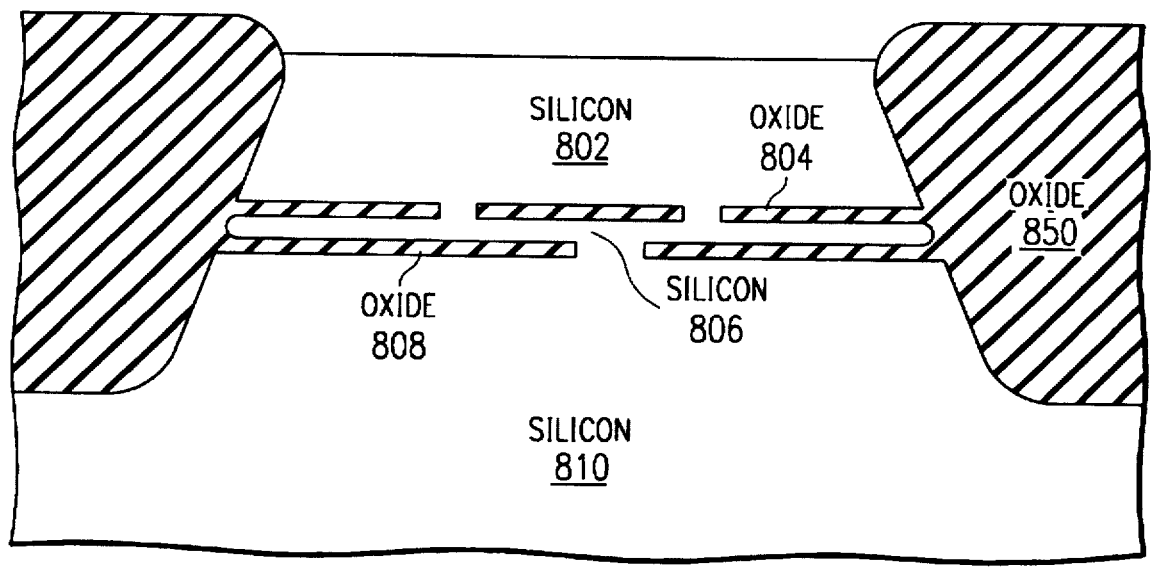

FIG. 8 heuristically illustrates in cross sectional elevation view third preferred embodiment silicon/oxide resonant tunneling diode 800 which differs from diodes 400 and 700 by having oxide isolation rather than mesa isolation. Indeed, diode 800 may be fabricated along the lines of either diode 400 or diode 700 with replacement of the final mesa etching replaced by a masked thermal oxidation or oxygen implantation to form isolation oxide 850. Otherwise, oxide tunneling barriers 804/808 and silicon quantum well 806 plus silicon anode 802 and cathode 810 have the same characteristics as the corresponding parts of either diode 400 or diode 700.

Multipeak resonances

The preferred embodiments may be extended to multiple quantum wells in series to form resonant tunneling diodes with multiple resonant peaks simply be growing further tunneling barriers and quantum wells on the preferred embodiment structures. Indeed, with successive abutting quantum wells and tunneling barriers grown, a superlattice structure may be obtained analgous to that of the Tsu patent cited in the background.

Applications

Figure 1:
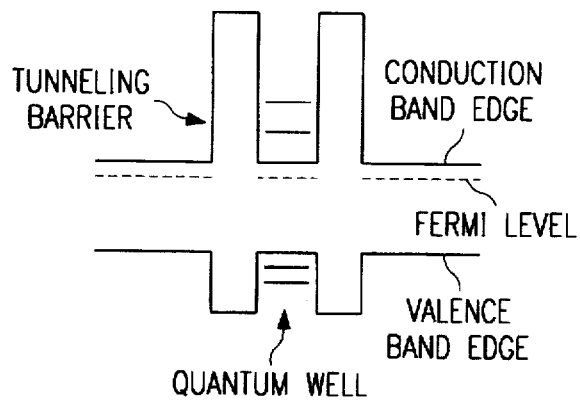
FIGS. 1–3b are band diagrams of a known resonant tunneling diode together with a current-voltage diagram.
Figure 2:
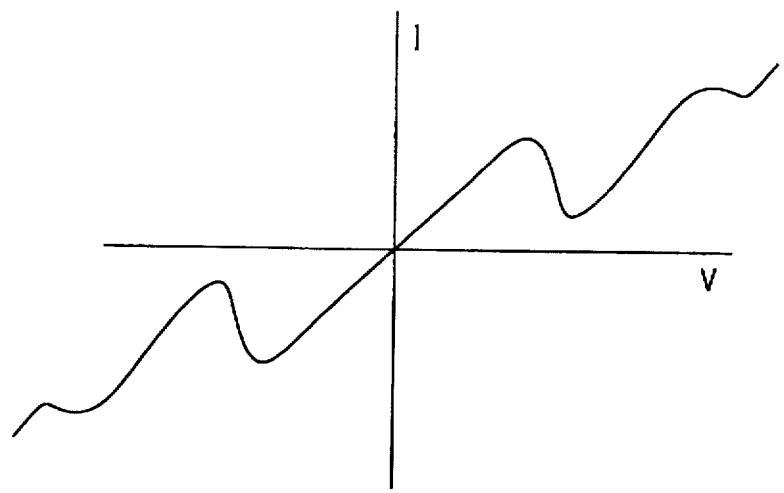
Figure 3A:
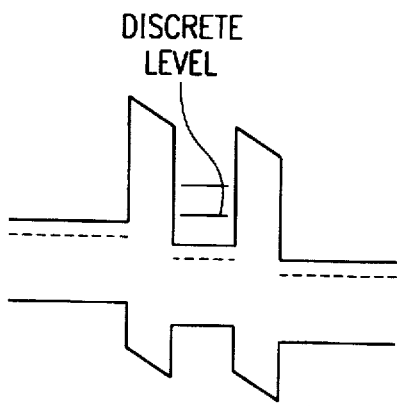
Figure 3B:
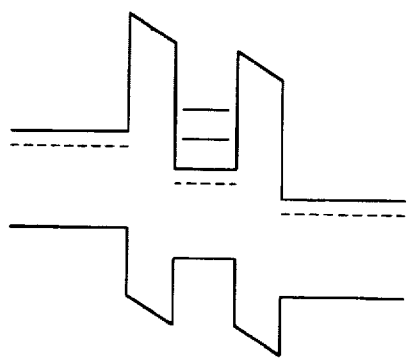
Figure 9:
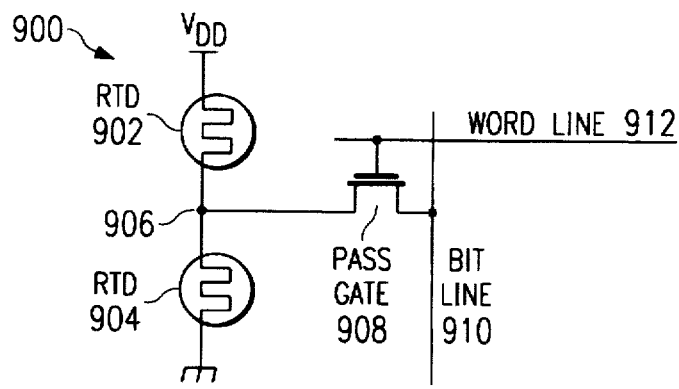
FIGS. 9–11 show a memory cell application of the preferred embodiment diodes.
Figure 10:
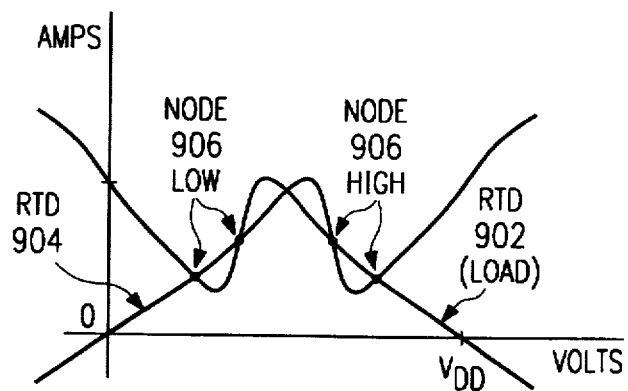
Figure 11:
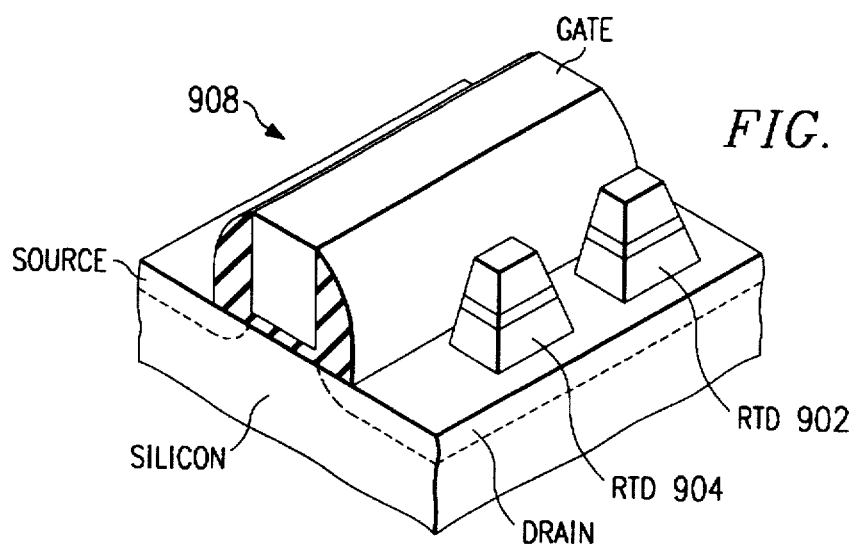

The preferred embodiments diodes may be incorporated into various structures such as the memory cell illustrated in FIGS. 9–11. In particular, FIG. 9 schematically shows static random access memory (SRAM) cell 900 as including resonant tunneling diodes 902 and 904 in series (RTD 902 acts as the load for RTD 904) and coupled to bitline 910 by silicon field effect transistor pass gate 908 controlled by the voltage on word line 912. The bistability of node 906 of cell 900 derives from the bias voltage Vdd being set a little greater than the current valley of each RTD, so one RTD operates in its valley and the other RTD operates with small bias. FIG. 10 shows the superimposed current-voltage curves for RTDs 902–904 where each RTD has the characteristics illustrated in FIG. 2. The intersection points (a pair for the voltage on node 906 close to Vdd (high) and a pair for node 906 low) indicate the stable series operation points. And accessing node 906 through pass gate 908 with a large driver to force node 906 either high or low will force cell 900 into a desired stable state; whereas, a sense amplifier accessing node 906 through pass gate 908 will detect the cell's state without disruption. Of course, a larger peak-to-valley ratio in the RTDs than that shown in FIG. 2 will make the high and low stable voltages for node 906 closer to Vdd and 0, respectively.

FIG. 11 illustrates in perspective view the structure of FIG. 9 using a single silicon field effect transistor plus the preferred embodiment RTDs. Note that the parallel arrangement of the RTDs on the field effect transistor drain permits simultaneous fabrication with a mesa etch defining the locations of the RTDs.

Epitaxial tunneling barrier

The preferred embodiments may also be applied to epitaxial tunneling barriers, such as the two monolayer, strained layer oxide of the Tsu patent cited in the background and calcium fluoride (CaF$_2$) and zinc sulfide (ZnS) tunneling barriers which are latticed matched to silicon. Indeed, the use of openings for epitaxial growth of silicon through and onto the other side of a tunneling barrier layer will insure good lattice match of this grown silicon for both latticed matched layers and nonlatticed matched layers. A recrystallization anneal may be required to eliminate crystal defects such as may arise from silicon nucleation on the barrier layer which is independent of the growth through the openings. A high growth temperature will likely lessen the anneal need.

In general, any crystalline material could be substituted for silicon and any other material for the tunneling barrier layer material, and the preferred embodiment approach of forming openings in the tunneling barrier layer to extend the crystalline material epitaxial growth will still apply. Further, the tunneling barriers could be superlattices as in Tsu, and multiple diodes could be formed in stacks or in parallel and inserted into emitters of bipolar or hot electron transistors. Lastly, the epitaxial material may be changed during each overgrowth so that the quantum well material could differ from the anode and cathode materials and still be lattice matched (or strained to match).

Modifications and advantages

The preferred embodiments may be varied in many ways while retaining one or more of the features of epitaxial alignment of anode, cathode, and quantum well layers by openings in barrier layers for epitaxial growth and such resonant tunneling heterostructures.

For example, the dimensions and grid patterns could be varied provided no openings with too large a diameter appear, for instance, the two tunneling barriers could have different patterns, the patterns could change within a single tunneling barrier, the tunneling carrier could be holes rather than electrons. The ion beam removal of oxide to form the tunneling barrier grids could be inert gas ions such as helium, neon, argon, krypton, or xenon which would provide a larger mass ion for selectable momentum transfer efficiency and still yield neutral products which evaporate. Heterojunction bipolar transistors with resonant tunneling diodes imbedded in the emitters and with silicon-germanium bases or homojunctions bipolar transistors with resonant tunneling diodes imbedded in the emitters may be fabricated.

The tunneling barrier oxide openings to insure epitaxial silicon has the advantage of providing resonant tunneling structures in the standard silicon/oxide materials system. And in transistors and circuits the resonant tunneling structures have an advantage of increasing the amount of logic or memory performed per unit area. For example, resonant tunneling bipolar transistors consisting of resonant tunneling elements in the emitter of conventional bipolar transistors have been used to construct full adder circuits with one third the usual number of transistors and one third the gate delay of conventional technology.

What is claimed is:

1. A resonant tunneling diode, comprising:

(a) a first terminal, a second terminal, and a quantum well; and (b) first and second tunneling barriers, said first tunneling barrier separating said quantum well from said first terminal and said second tunneling barrier separating said quantum well from said second terminal, said first tunneling barrier including a region of material having the same bandgap as at least one of said first terminal and said quantum well and which abuts both said quantum well and said first terminal and also including a second region of material having a bandgap larger than at least one of said first terminal and said quantum well.

2. The diode of claim 1, wherein:

(a) said first terminal, said second terminal, and said quantum well are made of silicon; and (b) said first tunneling barrier and said second tunneling barrier include a compound of silicon and oxygen.

3. The diode of claim 1, wherein:

(a) said region has a grid pattern.

4. The diode of claim 2, wherein:

(a) said compound is silicon dioxide.

5. An integrated circuit, comprising:

(a) a silicon-based transistor; and (b) a silicon resonant tunneling diode with tunneling barriers including an amorphous silicon-oxygen compound, said diode coupled to said transistor.

6. The integrated circuit of claim 5, wherein:

(a) said tunneling barriers each includes a region of silicon which abuts silicon regions on both sides of one of said tunneling barriers.

7. The integrated circuit of claim 6, wherein:

(a) said region of silicon has a grid pattern.

8. The integrated circuit of claim 5, wherein:

(a) said silicon-oxygen compound is silicon dioxide.

9. The integrated circuit of claim 5, wherein:

(a) said transistor is an insulated gate field effect transistor.

* * * * *